(12) United States Patent
Kamiya

(10) Patent No.: US 11,336,306 B2
(45) Date of Patent: May 17, 2022

(54) DECODING APPARATUS, DECODING METHOD, AND NON-TRANSITORY COMPUTER READABLE MEDIUM

(71) Applicant: NEC CORPORATION, Tokyo (JP)

(72) Inventor: Norifumi Kamiya, Tokyo (JP)

(73) Assignee: NEC CORPORATION, Tokyo (JP)

( * ) Notice: Subject to any disclaimer, the term of this patent is extended or adjusted under 35 U.S.C. 154(b) by 0 days.

(21) Appl. No.: 16/972,957

(22) PCT Filed: Jun. 8, 2018

(86) PCT No.: PCT/JP2018/021970
§ 371 (c)(1),
(2) Date: Dec. 7, 2020

(87) PCT Pub. No.: WO2019/234903
PCT Pub. Date: Dec. 12, 2019

(65) Prior Publication Data
US 2021/0250052 A1     Aug. 12, 2021

(51) Int. Cl.
*H03M 13/41*     (2006.01)
*H03M 13/39*     (2006.01)
(Continued)

(52) U.S. Cl.
CPC ....... *H03M 13/4115* (2013.01); *H03M 13/13* (2013.01); *H03M 13/256* (2013.01); *H03M 13/3961* (2013.01); *H03M 13/41* (2013.01)

(58) Field of Classification Search
CPC ............. H03M 13/4115; H03M 13/41; H03M 13/3961
See application file for complete search history.

(56) References Cited

U.S. PATENT DOCUMENTS 4,777,636 A * 10/1988 Yamashita ............ H03M 13/41
714/795
5,432,803 A * 7/1995 Liu ................... H03M 13/3961
375/340
(Continued)

FOREIGN PATENT DOCUMENTS

JP      11-031979 A      2/1999
JP      11-289258 A      10/1999
(Continued)

OTHER PUBLICATIONS

Nambirajan Seshadri, "List Viterbi Decoding Algorithms with Applications", IEEE Transactions on Communications, 1994, pp. 313-323, vol. 42, No. 2/3/4.
(Continued)

*Primary Examiner* — Joseph D Torres
(74) *Attorney, Agent, or Firm* — Sughrue Mion, PLLC

(57) ABSTRACT

A decoding apparatus includes a multi-input branch metric calculation unit configured to calculate, by using a branch label corresponding to a path extending toward a state S at a time point N in a trellis diagram and a plurality of reception signal sequences, a branch metric in the state S, a path metric calculation unit configured to calculate a path metric in the state S at the time point N, and a surviving path list memory configured to store path labels corresponding to L path metrics among a plurality of calculated path metrics. The path metric calculation unit generates a path label in the state S at the time point N by combining the branch label with a path label in each of the states at the time point N−1 and the surviving path list memory outputs path labels corresponding to L path metrics.

7 Claims, 11 Drawing Sheets

(51) Int. Cl.
*H03M 13/13* (2006.01)
*H03M 13/25* (2006.01)

(56) References Cited

U.S. PATENT DOCUMENTS

| | | | | |
|---|---|---|---|---|
| 5,440,588 | A * | 8/1995 | Murakami | H03D 1/00 375/284 |
| 5,446,747 | A | 8/1995 | Berrou | |
| 5,537,444 | A | 7/1996 | Nill et al. | |
| 5,787,127 | A * | 7/1998 | Ono | H03M 13/41 375/341 |
| 5,933,462 | A | 8/1999 | Viterbi et al. | |
| 6,125,153 | A * | 9/2000 | Sugisawa | H03M 13/6569 375/341 |
| 7,298,798 | B1 * | 11/2007 | Chao | H04L 25/03203 341/143 |
| 2007/0079225 | A1 * | 4/2007 | Graef | H03M 13/4184 714/795 |

FOREIGN PATENT DOCUMENTS

| | | |
|---|---|---|
| JP | 2003-198435 A | 7/2003 |
| JP | 2011-239107 A | 11/2011 |

OTHER PUBLICATIONS

Erdal Arikan, "Channel polarization: A method for constructing capacity-achieving codes for symmetric binary-input memoryless channels", IEEE Transactions on Information Theory, Jul. 2009, pp. 3051-3073, vol. 55, No. 7.

Ido Tal et al., "List Decoding of Polar Codes", IEEE Transactions Information Theory, May 2015, pp. 2213-2226, vol. 61, No. 5.

International Search Report for PCT/JP2018/021970 dated Aug. 28, 2018 (PCT/ISA/237).

* cited by examiner

US 11,336,306 B2

DECODING APPARATUS, DECODING METHOD, AND NON-TRANSITORY COMPUTER READABLE MEDIUM

CROSS REFERENCE TO RELATED APPLICATIONS

This application is a National Stage of International Application No. PCT/JP2018/021970 filed Jun. 8, 2018.

TECHNICAL FIELD

The present disclosure relates to a decoding apparatus, a decoding method, and a program.

BACKGROUND ART

In the operations of digital data communication systems and storage systems, countermeasures against bit errors, which may be caused by various factors, are taken. Among typical examples of such countermeasures, an error correction encoding technique is known, in which redundant data is added, so that bit errors can be corrected.

The error correction encoding technique is composed of an encoding process (encoding) for generating a transmission signal sequence while adding redundant data to information data on the transmitting side, and a decoding process (decoding) for inferring a transmission signal sequence from a reception signal sequence containing noises received on the receiving side. In general, the decoding process requires a larger amount of calculation than that in the encoding process. Therefore, improving the efficiency of the calculation of the decoding process together with how to realize this improvement is often considered to be a problem to be solved.

As an ordinary decoding processing method, a Viterbi decoder using a Viterbi algorithm is well known. In this method, a transmission signal sequence is regarded as a path in a graph called a trellis diagram, and a Viterbi algorithm is used as means for efficiently selecting a path having the highest likelihood for a given reception sequence. The Viterbi decoder adopts a method for inferring a transmission signal sequence by using the Viterbi algorithm.

Several methods for improving such a Viterbi decoder in order to improve the error correction performance thereof have been known. Each of Patent Literature 2 and Non-patent Literature 1 discloses a list output Viterbi decoder that selects and outputs a predetermined number of paths in descending order of their likelihoods for a reception sequence, rather than selecting only one path having the highest likelihood therefor. Further, Patent Literature 3 discloses a soft-output Viterbi decoder that, instead of outputting a path having a high likelihood, calculates and outputs a reliability (a posterior probability) for each bit of a transmission signal sequence determined by the path. It has been known that all of these methods are useful as a decoding processing method for a concatenated encoding scheme in which a plurality of error correction codes are used in combination as shown in Patent Literature 1.

Further, Patent Literature 4 discloses a configuration of a Viterbi decoder in a MIMO (Multiple-Input Multiple-Output) transmission system including a plurality of transmission antennas and a plurality of reception antennas. The Viterbi decoder disclosed in Patent Literature 4 calculates a transmission signal sequence from one reception signal sequence received from the plurality of reception antennas.

CITATION LIST

Patent Literature

Patent Literature 1: U.S. Pat. No. 5,446,747
Patent Literature 2: U.S. Pat. No. 5,537,444
Patent Literature 3: U.S. Pat. No. 5,933,462
Patent Literature 4: Japanese Unexamined Patent Application Publication No. 2011-239107

Non Patent Literature

Non-patent Literature 1: N. Seshadri and C.-E. W. Sundberg, "List Viterbi decoding algorithms with applications," IEEE Transactions on Communications, vol. 42, no. 2/3/4, February/March/April 1994.
Non-patent Literature 2: E. Arikan, "Channel polarization: A method for constructing capacity-aligning codes for symmetric binary-input memoryless channels," IEEE Transactions on Information Theory, vol. 55, no. 7, pp. 3051 -3073, July 2009.
Non-patent Literature 3: I. Tal and A. Vardy, "List decoding of polar codes," IEEE Transactions on Information Theory, vpl. 61, no. 5, pp. 2213 -2226, May 2015.

SUMMARY OF INVENTION

Technical Problem

As described above, all of the ordinary Viterbi decoders and their improved versions calculate, for one given reception signal sequence, a transmission signal sequence corresponding to the reception signal sequence, a list of candidates of the transmission signal sequence, or a reliability thereof. That is, the purpose of the ordinary Viterbi decoders and their improved versions is to improve the accuracy of the result of the decoding processing by increasing the amount of information related to the transmission signal sequence corresponding to the one given reception signal sequence. As an advanced form of this technique, it has been required to, when a plurality of reception signal sequences, i.e., inputs, are given, calculate a list of transmission signal sequences having high likelihoods for at least one of the reception signal sequences.

An object of the present disclosure is to provide a decoding apparatus, a decoding method, and a program capable of, when a plurality of reception signal sequences, i.e., inputs, are given, calculating a list of transmission signal sequences having high likelihoods for at least one of the reception signal sequences.

Solution to Problem

A decoding apparatus according to a first aspect of the present disclosure includes: a multi-input branch metric calculation unit configured to calculate, by using a branch label corresponding to a path extending toward a state S (S is an integer no less than zero) at a time point N (N is an integer no less than zero) in a trellis diagram and a plurality of reception signal sequences, a branch metric in the state S; a path metric calculation unit configured to calculate a path metric in the state S at the time point N by adding a branch metric in the state S at the time point N to a path metric in each of states at a time point N−1, each of which forms a path with the state S at the time point N; and a surviving path list memory configured to store path labels corresponding to L path metrics (L is an integer no less than one) among a plurality of calculated path metrics, in which the path metric calculation unit generates a path label in the state S at the time point N by combining the branch label with a path label in each of the states at the time point N−1, each of which forms a path with the state S at the time point N, and the surviving path list memory outputs, as a transmission signal sequence, path labels corresponding to L path metrics selected at an end point in the trellis diagram.

A decoding method according to a second aspect of the present disclosure includes: calculating, by using a branch label corresponding to a path extending toward a state S (S is an integer no less than zero) at a time point N (N is an integer no less than zero) in a trellis diagram and a plurality of reception signal sequences, a branch metric in the state S; calculating a path metric in the state S at the time point N by adding a branch metric in the state S at the time point N to a path metric in each of states at a time point N−1, each of which forms a path with the state S at the time point N; storing path labels corresponding to L path metrics (L is an integer no less than one) among a plurality of calculated path metrics; generating a path label in the state S at the time point N by combining the branch label with a path label in each of the states at the time point N−1, each of which forms a path with the state S at the time point N; and outputting, as a transmission signal sequence, path labels corresponding to L path metrics selected at an end point in the trellis diagram.

A program according to a third aspect of the present disclosure causes a computer to: calculate, by using a branch label corresponding to a path extending toward a state S (S is an integer no less than zero) at a time point N (N is an integer no less than zero) in a trellis diagram and a plurality of reception signal sequences, a branch metric in the state S; calculate a path metric in the state S at the time point N by adding a branch metric in the state S at the time point N to a path metric in each of states at a time point N−1, each of which forms a path with the state S at the time point N; store path labels corresponding to L path metrics (L is an integer no less than one) among a plurality of calculated path metrics; generate a path label in the state S at the time point N by combining the branch label with a path label in each of the states at the time point N−1, each of which forms a path with the state S at the time point N; and output, as a transmission signal sequence, path labels corresponding to L path metrics selected at an end point in the trellis diagram.

Advantageous Effects of Invention

According to the present disclosure, it is possible to provide a decoding apparatus, a decoding method, and a program capable of, when a plurality of reception signal sequences, i.e., inputs, are given, calculating a list of transmission signal sequences having high likelihoods for at least one of the reception signal sequences.

DESCRIPTION OF EMBODIMENTS

First Example Embodiment

Figure 10:
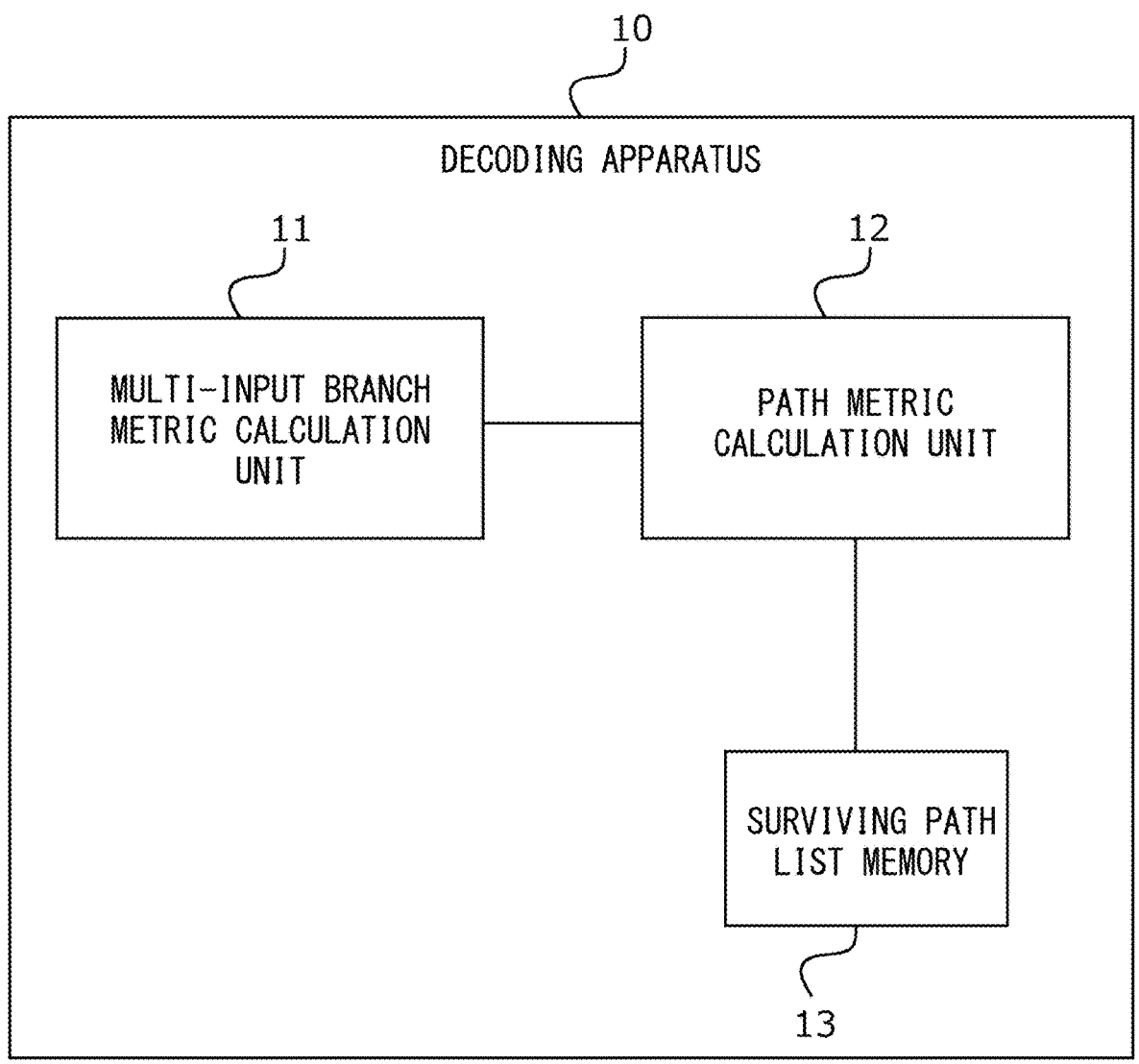
FIG. 10 is a configuration diagram of a decoding apparatus according to a first example embodiment.

Example embodiments according to the present disclosure will be described hereinafter with reference to the drawings. Firstly, a configuration diagram of a decoding apparatus 10 according to a first example embodiment will be described with reference to FIG. 10. The decoding apparatus 10 may be a computer apparatus that operates as a processor executes a program stored in a memory. The decoding apparatus 10 includes a multi-input branch metric calculation unit 11, a path metric calculation unit 12, and a surviving path list memory 13. The multi-input branch metric calculation unit 11, the path metric calculation unit 12, and the surviving path list memory 13 may be software or modules by which processing is performed as the processor executes a program stored in the memory. Alternatively, the multi-input branch metric calculation unit 11, the path metric calculation unit 12, and the surviving path list memory 13 may be hardware such as a circuit(s) or a computer chip(s).

The multi-input branch metric calculation unit 11 calculates, by using a branch label corresponding to a path extending toward a state S (S is an integer no less than zero) at a time point N (N is an integer no less than zero) in a trellis diagram and a plurality of reception signal sequences, a branch metric in the state S at the time point N. The branch label is expressed by using, for example, a bit string. The branch metric indicates a distance between a reception signal sequence and a branch label. The smaller the numerical value of the branch metric is, the higher the likelihood of the branch label for the reception signal sequence is.

The path metric calculation unit 12 calculates a path metric in the state S at the time point N by adding a branch metric in the state S at the time point N to a path metric in each of states at a time point N−1, each of which forms a path with the state S at the time point N. That is, the path metric is expressed as cumulative additions of branch metrics.

Further, the path metric calculation unit 12 generates a path label in the state S at the time point N by combining the branch label with a path label in each of the states at the time point N−1, each of which forms a path with the state S at the time point N. The path label has a value that is obtained by combining branch labels associated with a path that passes from a time point 0 to a time point N. The path label may also be expressed as a transmission signal sequence.

The surviving path list memory 13 stores path labels corresponding to L path metrics (L is an integer no less than one) among a plurality of calculated path metrics. Further, the surviving path list memory 13 outputs, as a transmission signal sequence, path labels corresponding to L path metrics selected at the end point in the trellis diagram. Further, the surviving path list memory 13 may store path labels corresponding to L path metrics in ascending order of their values among the plurality of calculated path metrics.

There is at least one state at the end point in the trellis diagram. The surviving path list memory 13 stores path labels corresponding to L path metrics associated with a path extending toward at least one state present at the end point in the trellis diagram.

As described above, the decoding apparatus 10 shown in FIG. 10 can calculate L transmission signal sequences having high likelihoods for at least one of a plurality of reception signal sequences. The L transmission signal sequences having high likelihoods are output in the form of a list of transmission signal sequences.

Second Example Embodiment

Next, a flowchart of a multi-input/list output Viterbi decoding method performed by the decoding apparatus according to the second example embodiment will be described with reference to FIG. 1.

Figure 1:
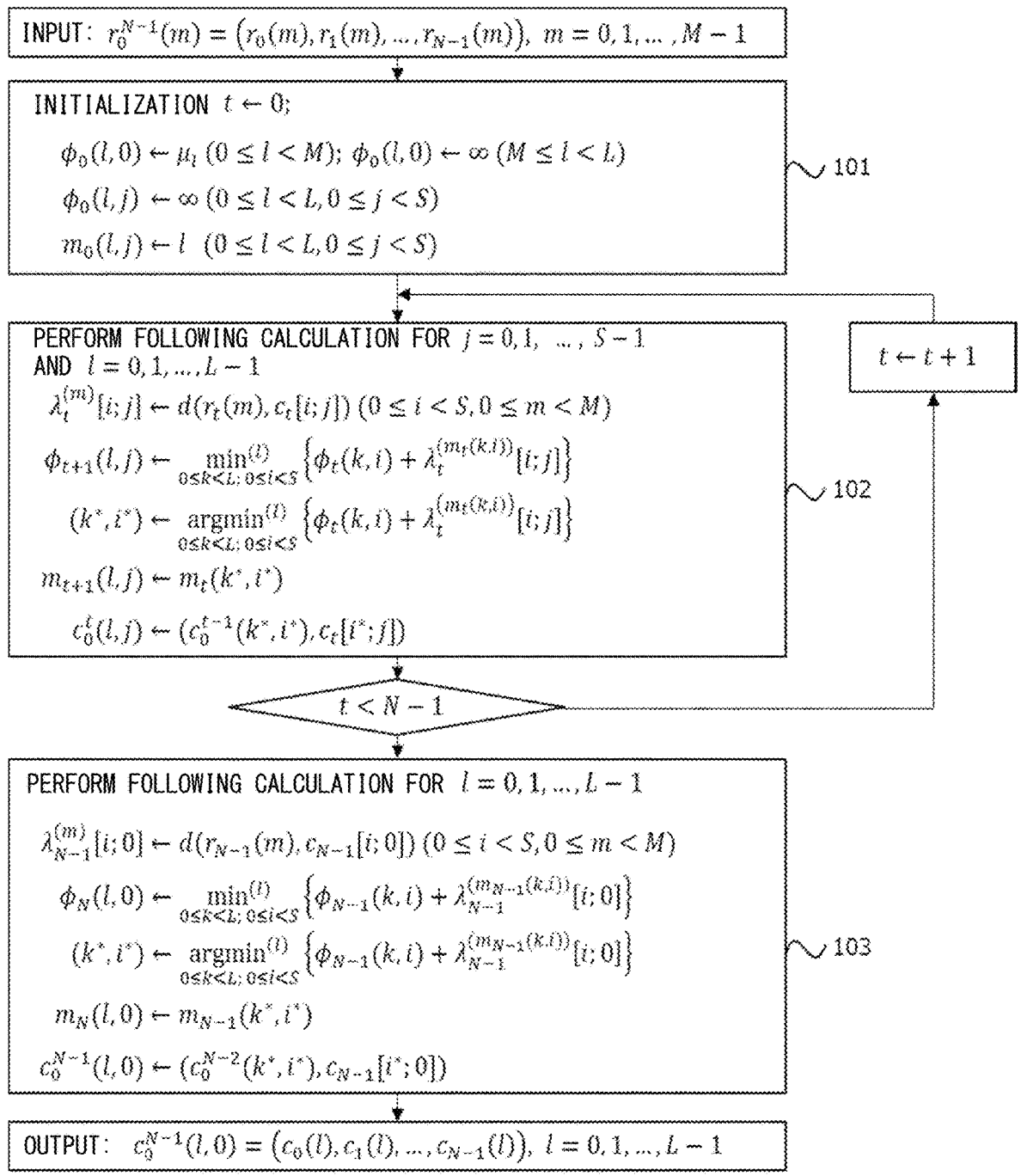
FIG. 1 is a flowchart of a multi-input/list output Viterbi decoding method according to a second example embodiment.

The flowchart shown in FIG. 1 includes an initialization method (101), a successive calculation method (102), and a termination method (103). When the decoding apparatus performs the flowchart shown in FIG. 1, M reception signal sequences (M is an integer no less than two; N is a positive number) each of which has a length N are given as inputs. The M reception signal sequences having the length N are represented as $r_0^{N-1}(m)=(r_0(m),r_1(m), \ldots ,r_{N-1}(m))$, $m=0, 1, \ldots, M-1$. Further, the L transmission signal sequences output in FIG. 1 are represented as $c_0^{N-1}(l,0)$, $l=0, 1, \ldots, L-1$. They are expressed as a list of L transmission signal sequences having high likelihoods for at least one of $r_0^{N-1}(m)$, $m=0, 1, \ldots, M-1$. In the flowchart shown in FIG. 1, $\varphi_t(l,i)$ and $c_0^{t-1}(l,i)$ represent a path metric and a path label related to a lth surviving path in a state I at each time point t. Further, $m_{t-1}(l,i)$ represents an index specifying a reception signal sequence, and it means that a path metric $\varphi_t(l,i)$ is calculated from a path label $c_0^{t-1}(l,i)$ and a reception signal sequence $r_0^{t-1}(m_{t-1}(l,i))$. The method for calculating a path metric will be described later.

Figure 2:
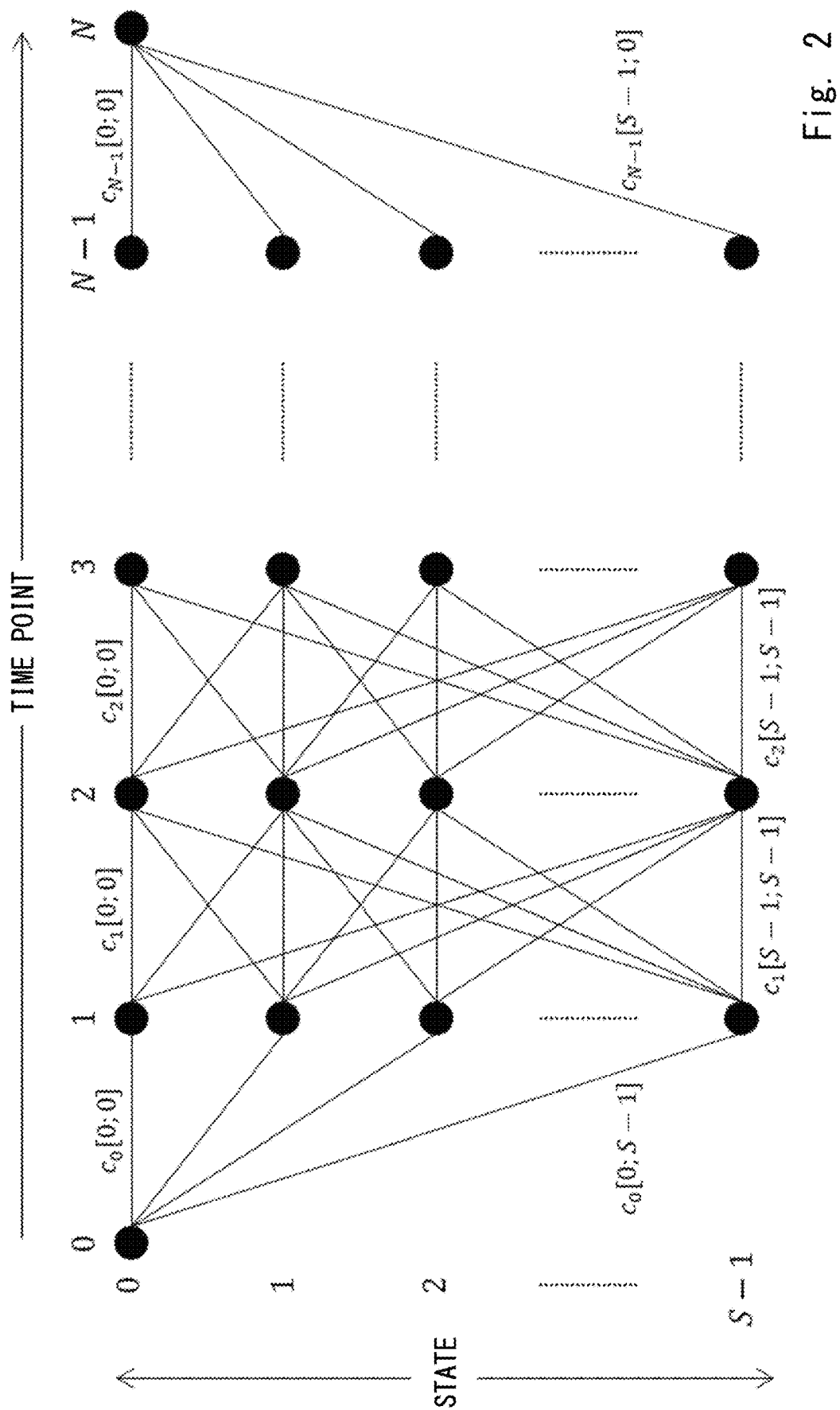
FIG. 2 shows an example of a trellis diagram according to the second example embodiment.

FIG. 2 shows an example of the trellis diagram. Nodes indicated by black circles represent states. There are N+1 time points from a point 0, i.e., the start point to a point N, i.e., the end point (in the horizontal direction in FIG. 2), and these states are classified according to the time point. In FIG. 2, there are S states at each time point. In the trellis diagram, when there is a branch between a state i at a time point t and a state j at a time point t+1, a bit string is assigned to that branch. Further, it is called a branch label and expressed as $c_t[i;j]$.

A branch metric between a reception signal $r_t(m)$ and a branch label $c_t[i;j]$ is represented as $\lambda_t^{(m)}[i;j]$. An example of the method for calculating a branch metric is shown below. When the branch label $c_t[i;j]$ is composed of a B-bit data $b_0, b_1, \ldots, b_{B-1}$, the reception signal $r_t(m)$ can be expressed by B real values $y_0, y_1, \ldots, y_{B-1}$. Note that the branch metric $\lambda_t^{(m)}[i;j]$ is determined by the below-shown Expression 1.

[Expression 1]

$$\lambda_t^{(m)}[i; j] = \sum_{k=0}^{B-1} |y_k|\delta(b_k, y_k) \quad \text{(Expression 1)}$$

In the Expression 1, $\delta(b_k, y_k)$ is a function that becomes zero when $b_k=1$ and $y_k<0$, or when $b_k=0$ and $y_k\geq 0$, and becomes one in all the other cases. This branch metric represents a distance between the reception signal and the transmission bit string. Further, it can be said that the smaller the branch metric value is, the higher the likelihood of the branch label for the reception signal is. Note that it is assumed that when there is no branch between the state i at the time point t and the state j at the time point t+1, $\lambda_t^{(m)}[i;j]$ is infinity ($\lambda_t^{(m)}[i;j]=\infty$. In FIG. 1, the right side of the Expression 1 is $d(r_t(m), c_t[i;j])$).

The path metric is cumulative additions of branch metrics. The path label is a sequence of branch labels, i.e., a transmission signal sequence. Therefore, the path metric is a numerical value representing a distance between a reception signal sequence and a transmission signal sequence. Further, it can be said that the smaller the path metric is, the higher the likelihood is.

Figure 3:
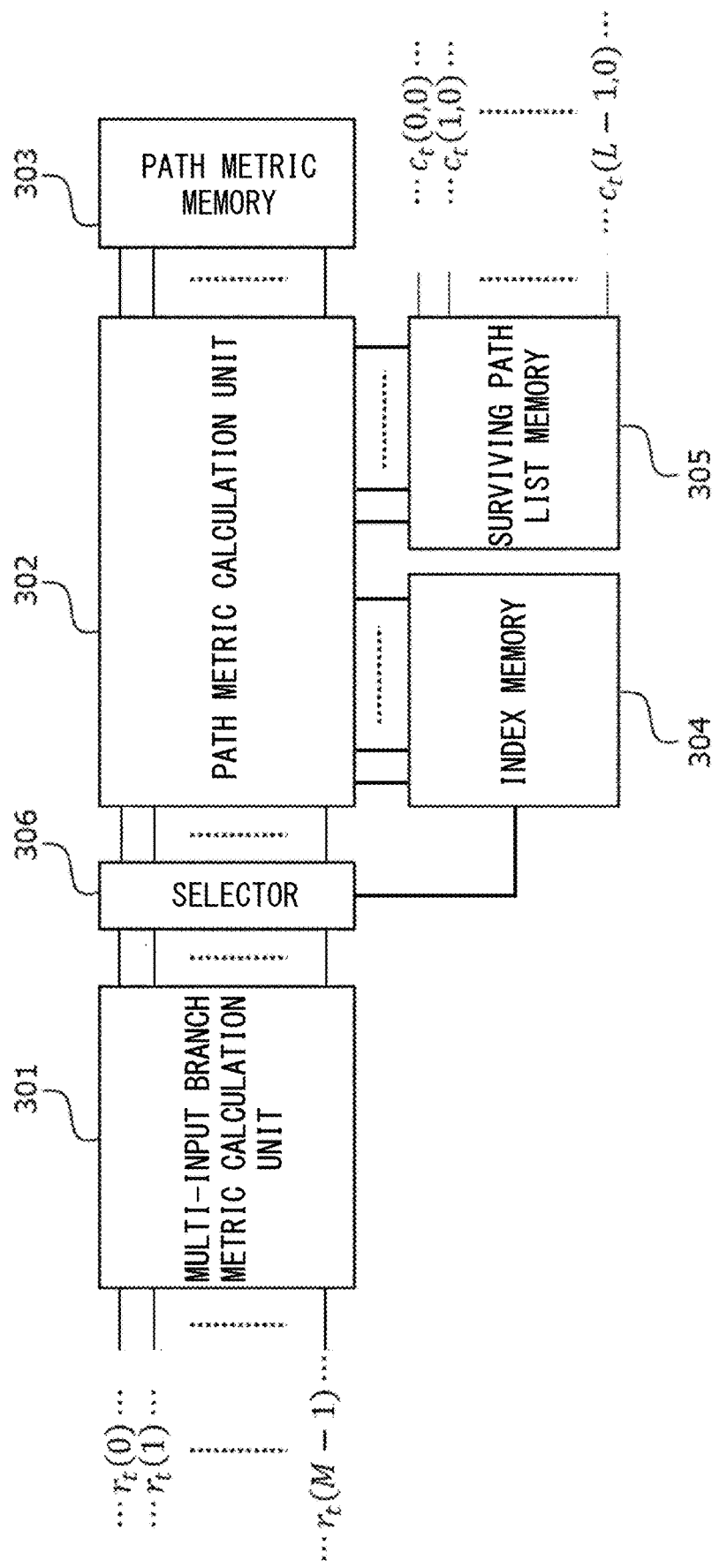
FIG. 3 is a configuration diagram of a multi-input/list output Viterbi decoder according to the second example embodiment.

FIG. 3 is a block diagram showing a configuration example of a multi-input/list output Viterbi decoder according to the present disclosure. The multi-input/list output Viterbi decoder shown in FIG. 3 includes a multi-input branch metric calculation unit 301 that calculates the branch metric shown by the Expression 1 from each of the M reception signal sequences. Further, the multi-input/list output Viterbi decoder includes a path metric calculation unit 302 that calculates a path metric. Further, the multi-input/list output Viterbi decoder includes a path metric memory 303 that stores path metrics of surviving paths. Further, the multi-input/list output Viterbi decoder includes an index memory 304 that stores indexes of reception signal sequences corresponding to the surviving paths. The index memory 304 further generates a selection signal of a selector 306 that selects a branch metric necessary to calculate a path metric from an output of the multi-input branch metric calculation unit 301. Further, the multi-input/list output Viterbi decoder includes a surviving path list memory 305 that stores a list of surviving paths.

Description of Operation

Next, operations shown in FIG. 1 according to the second example embodiment will be described with reference to the trellis diagram shown in FIG. 2. M reception signal sequences each having a length N, which are expressed as $r_0^{N-1}(m)$, $m=0, 1, \ldots, M-1$, are given as inputs to the multi-input/list output Viterbi decoder. For simplicity, it is assumed that M is equal to or smaller than a list size L of transmission signal sequences to be output ($M \leq L$).

In the initialization method (101) shown in FIG. 1, the multi-input ranch metric calculation unit 301 sets an initial value of a path metric at a time point 0 in FIG. 2 and an initial value of an index for specifying a reception signal sequence corresponding to the path metric. As described above, $\varphi_0(l, 0)$ represents a lth path metric at the time point 0 in the state 0, and is specified to a predefined initial value $\mu_l$ for $l=0, 1, \ldots, M-1$. In the following description, the initial value is set to 0 for simplicity. Further, a maximum numerical value (expressed as $\infty$) is assigned to path metrics $\varphi_0(l,j)$ at the time point 0 in the states other than the above-described state. Further, the index of the reception signal sequence for the path metric, to which the maximum numerical value is assigned, is specified as $m_0(l,j)=1$, $0 \le l < L$, $0 \le j < S$. Note that the index $m_0(l,j)$ may have an arbitrary value except in the case where j is zero (J=0).

In the successive calculation method (102), the multi-input branch metric calculation unit 301 calculates surviving path labels and the like at a time point t+1 by using path labels and the like of the surviving paths at the time point t. Each of the path labels or the like of the surviving paths includes a path label of the surviving path, a path metric thereof, and an index for specifying a reception signal sequence for calculating the path metric.

The multi-input branch metric calculation unit 301 first calculates a branch metric $\lambda_t^{(m)}[i;j]$ by using a reception signal $r_t(m)$, a branch label $c_t[i;j]$ between the state i at the time point t and the state j at the time point t+1, and the Expression 1. It is assumed that the branch metric is calculated for all the cases expressed by $0 \le m < M$, $0 \le i, j < S$.

Next, a method for calculating a path metric related to a surviving path for each state j at the time point t+1 by using a branch metric will be described. By using the path metrics of the surviving paths and the aforementioned branch metrics in the state i at the time point t, calculation expressed by the below-shown Expression 2 is performed for all the cases expressed by $0 \le k < L$, $0 \le i < S$.

[Expression 2]

$$\varphi_t(k,i) + \lambda_t^{(m_t(k,i))}[i;j] \qquad \text{(Expression 2)}$$

Note that $m_t(k,i)$ is an index for specifying a reception signal sequence related to calculation of a path metric $\varphi_t(k,i)$. Therefore, the Expression 2 is a path metric of a path that reaches the state j at the time point t+1 through the state i at the time point t. The values of the Expression 2 are calculated over all the cases expressed by $0 \le k < L$, $0 \le i < S$, and a lth path metric ($0 < l < L$) counted from the smallest one is expressed as $\varphi_{t+1}(l,j)$ as the path metric of a lth surviving path in the state j at the time point t+1. In the Expression 2, when a pair of k and i that give $\varphi_{t+1}(l,j)$ are expressed as k* and i*, respectively, the index $m_{t+1}(l,j)$ of the reception signal sequence related to the calculation of the path metric $\varphi_{t+1}(l,j)$ is expressed as $m_t(k^*,i^*)$. Note that in FIG. 1, $\min^{(l)}$ means a lth smallest value, and $\text{argmin}^{(l)}$ means a value (a pair of k and i) in a domain in which it takes the lth smallest value.

A path label representing a lth surviving path in the state j at the time point t+1 is represented as $c_0^t(l,j)$. The path label $c_0^t(l,j)$ is expressed, by using the aforementioned k* and i*, as a combination of a path label $c_0^{t-1}(k^*,i^*)$ of a k*th surviving path in a state i* at the time point t with a branch label $c_t[i^*;j]$ between the state i* at the time point t and a state j at the time point t+1. In the successive calculation method (102), the above-described processes are repeated from the time point 1 to the time point N−1.

In the terminating method (103), a path label of a surviving path, a path metric thereof, and an index for specifying a reception signal sequence for calculating the path metric at the end point N are calculated. There is no branch at the end point other than the state 0. Therefore, the operations are similar to those in the successive calculation method (102) except that only the path that reaches the state 0 is taken into consideration. Through the method described above, for the M reception signal sequences each having a length N, i.e., the sequences expressed as $r_0^{N-1}(m)$, m=0, 1, ..., M−1, L transmission signal sequences $c_0^{N-1}(l,0)$, l=0, 1, ..., L−1 having large likelihoods for at least one of them are calculated.

Operations performed by the multi-input/list output Viterbi decoder shown in FIG. 3 are similar to those described above with reference to the flowchart shown in FIG. 1. The multi-input branch metric calculation unit 301 calculates the aforementioned branch metrics $\lambda_t^{(m)}[i;j]$ in the successive calculation method (102) and the termination method (103) shown in FIG. 1. The branch metric calculated by the multi-input branch metric calculation unit 301 is output to the path metric calculation unit 302 through the selector 306. The path metric calculation unit 302 calculates a path metric by using the Expression 2. Note that the path metric $\varphi_t(k,i)$ in the Expression 2 is held in the path metric memory 303. The index $m_t(k,i)$ is held in the index memory 304. The path metric calculation unit 302 adds a branch metric specified by $m_t(k,i)$ received through the selector 306 to $\varphi_t(k,i)$. Similarly to the operations described above with reference to FIG. 1, a newly selected path metric $\varphi_{t+1}(l,j)$ is stored in the path metric memory 303. The index $m_{t+1}(l,j)$ is held in the index memory 304. The path label $c_0^{t-1}(l,j)$ is stored in the surviving path list memory 305.

Specific Example of Operation

Figure 8:
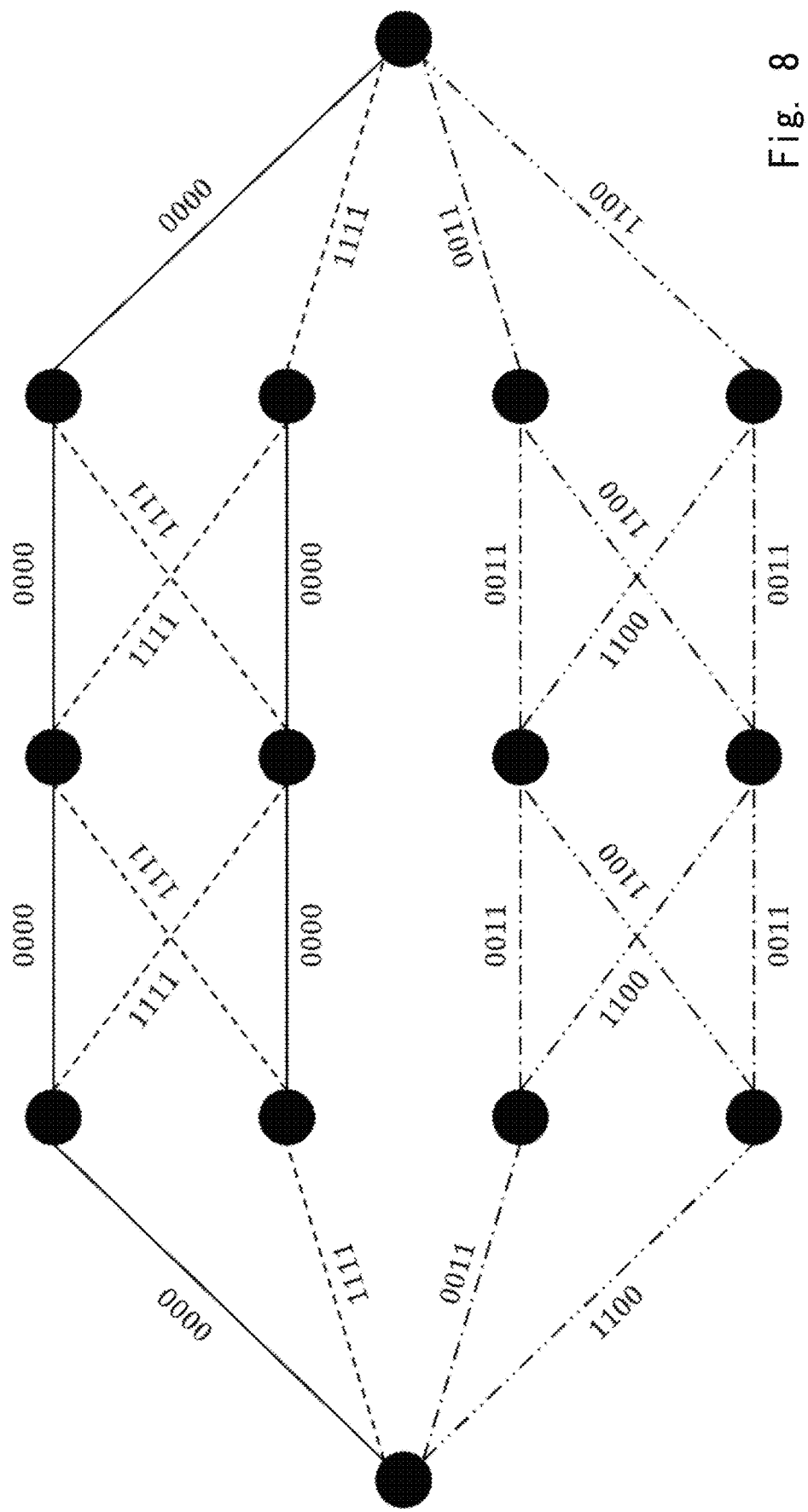
FIG. 8 shows specific operations performed by the multi-input/list output Viterbi decoder according to the second example embodiment.

Next, a specific example of operations performed by the multi-input/list output Viterbi decoder shown in FIG. 3 will be described with reference to FIG. 8. FIG. 8 shows a trellis diagram which is used to explain specific operations. In the trellis diagram shown in FIG. 8, the number of time points N+1 is five (N+1=5) and the number of states is four (S=4). A 4-bit branch label is assigned to each branch in the trellis diagram shown in FIG. 8. A case where the number M of input reception signal sequences is four (M=4) and these reception signal sequences $r_0^3(m)$, m=0, 1, 2, 3 are given as shown below is explained.

$r_0(0)=(−4.26,−0.35,+0.47,+2.16)$, $r_1(0)=(−1.73,−0.17,+1.84,+0.94)$
$r_2(0)=(+0.42,+2.69,−4.89,−1.26)$, $r_3(0)=(+1.85,+2.03,+0.04,−2.59)$
$r_0(1)=(−4.26,−0.35,+0.47,+2.16)$, $r_1(1)=(−0.10,+2.01,−0.75,+0.27)$
$r_2(1)=(+0.42,+2.69,−4.89,−1.26)$, $r_3(1)=(+0.06,−2.76,−1.12,+2.05)$
$r_0(2)=(−0.58,+0.06,−1.80,−0.48)$, $r_1(2)=(−0.10,+2.01,−0.75,+0.27)$
$r_2(2)=(+0.42,+2.69,−4.89,−1.26)$, $r_3(2)=(+1.85,+2.03,+0.04,−2.59)$
$r_0(3)=(−0.58,+0.06,−1.80,−0.48)$, $r_1(3)=(−1.73,−0.17,+1.84,+0.94)$
$r_2(3)=(+0.42,+2.69,−4.89,−1.26)$, $r_3(3)=(+0.06,−2.76,−1.12,+2.05)$

Path metric and initial values of indexes for specifying reception signal sequences are set as described above in the initial setting method (101) shown in FIG. 1. Note that initial values of the path metrics are set as follows: $\mu_0=6.13$, $\mu_1=8.90$, $\mu_2=11.01$, and $\mu_3=11.62$, respectively. The calculation process is shown hereinafter for each time point and each state.

FIG. 8 shows that there are four patterns (0000, 1111, 0011, 1100) of branch labels in total between a time point 0 and a time point 1. The total of 16 branch metrics can be calculated according to the Expression 1 as follows.

$\lambda_0^{(0)}[0,0]=4.61$, $\lambda_0^{(0)}[0,1]=2.63$, $\lambda_0^{(0)}[0,2]=7.24$, $\lambda_0^{(0)}[0,3]=0.00$ $\lambda_0^{(1)}[0,0]=4.61$, $\quad \lambda_0^{(1)}[0,1]=2.63$, $\quad \lambda_0^{(1)}[0,2]=7.24$, $\lambda_0^{(1)}[0,3]=0.00$
$\lambda_0^{(2)}[0,0]=2.86$, $\quad \lambda_0^{(2)}[0,1]=0.06$, $\quad \lambda_0^{(2)}[0,2]=0.58$, $\lambda_0^{(2)}[0,3]=2.34$
$\lambda_0^{(3)}[0,0]=2.86$, $\quad \lambda_0^{(3)}[0,1]=0.06$, $\quad \lambda_0^{(3)}[0,2]=0.58$, $\lambda_0^{(3)}[0,3]=2.34$ Path metrics of surviving paths in states 0, 1, 2 and 3 at the time point t=1, the indexes specifying the reception signal sequences related to the calculation of the path metrics, and the surviving path labels are calculated according to the successive calculation method (102) shown in FIG. 1 as follows.

$\varphi_1(0,0)=10.74$, $m_1(0,0)=0$, $c_0(0,0)=0000$
$\varphi_1(1,0)=13.51$, $m_1(1,0)=1$, $c_0(1,0)=0000$
$\varphi_1(2,0)=13.87$, $m_1(2,0)=2$, $c_0(2,0)=0000$
$\varphi_1(3,0)=14.48$, $m_1(3,0)=3$, $c_0(3,0)=0000$
$\varphi_1(0,1)=8.76$, $m_1(0,1)=0$, $c_0(0,1)=1111$
$\varphi_1(1,1)=11.07$, $m_1(1,1)=2$, $c_0(1,1)=1111$
$\varphi_1(2,1)=11.53$, $m_1(2,1)=1$, $c_0(2,1)=1111$
$\varphi_1(3,1)=11.68$, $m_1(3,1)=3$, $c_0(3,1)=1111$
$\varphi_1(0,2)=11.59$, $m_1(0,2)=2$, $c_0(0,2)=0011$
$\varphi_1(1,2)=12.20$, $m_1(1,2)=3$, $c_0(1,2)=0011$
$\varphi_1(2,2)=13.37$, $m_1(2,2)=0$, $c_0(2,2)=0011$
$\varphi_1(3,2)=16.14$, $m_1(3,2)=1$, $c_0(3,2)=0011$
$\varphi_1(0,3)=6.13$, $m_1(0,3)=0$, $c_0(0,3)=1100$
$\varphi_1(1,3)=8.90$, $m_1(1,3)=1$, $c_0(1,3)=1100$
$\varphi_1(2,3)=13.35$, $m_1(2,3)=2$, $c_0(2,3)=1100$
$\varphi_1(3,3)=13.96$, $m_1(3,3)=3$, $c_0(3,3)=1100$ Similarly, there are four patterns (0000, 1111, 0011, 1100) of branch labels between the time point 1 and a time point 2, and a total of 16 branch metrics can be calculated according to the Expression 1. Using this calculation, each data for the time point t=2 is calculated as follows.

$\varphi_2(0,0)=11.55$, $m_2(0,0)=0$, $c_0^1(0,0)=1111\ 1111$
$\varphi_2(1,0)=12.64$, $m_2(1,0)=0$, $c_0^1(1,0)=0000\ 0000$
$\varphi_2(2,0)=13.35$, $m_2(2,0)=2$, $c_0^1(2,0)=1111\ 1111$
$\varphi_2(3,0)=13.85$, $m_2(3,0)=1$, $c_0^1(3,0)=1111\ 1111$
$\varphi_2(0,1)=10.66$, $m_2(0,1)=0$, $c_0^1(0,1)=1111\ 0000$
$\varphi_2(1,1)=11.92$, $m_2(1,1)=2$, $c_0^1(1,1)=1111\ 0000$
$\varphi_2(2,1)=12.38$, $m_2(2,1)=1$, $c_0^1(2,1)=1111\ 0000$
$\varphi_2(3,1)=13.52$, $m_2(3,1)=0$, $c_0^1(3,1)=0000\ 1111$
$\varphi_2(0,2)=6.13$, $m_2(0,2)=0$, $c_0^1(0,2)=1100\ 1100$
$\varphi_2(1,2)=11.66$, $m_2(1,2)=1$, $c_0^1(1,2)=1100\ 1100$
$\varphi_2(2,2)=11.96$, $m_2(2,2)=2$, $c_0^1(2,2)=0011\ 0011$
$\varphi_2(3,2)=13.97$, $m_2(3,2)=3$, $c_0^1(3,2)=1100\ 1100$
$\varphi_2(0,3)=9.27$, $m_2(0,3)=1$, $c_0^1(0,3)=1100\ 0011$
$\varphi_2(1,3)=10.81$, $m_2(1,3)=0$, $c_0^1(1,3)=1100\ 0011$
$\varphi_2(2,3)=12.20$, $m_2(2,3)=0$, $c_0^1(2,3)=0011\ 1100$
$\varphi_2(3,3)=13.37$, $m_2(3,3)=0$, $c_0^1(3,3)=0011\ 1100$ The branch label between the time point 2 and a time point 3 can also be calculated in a similar manner. By using this calculation, each data for the time point t=3 is calculated as follows.

$\varphi_3(0,0)=13.77$, $m_3(0,0)=0$, $c_0^2(0,0)=1111\ 0000\ 1111$
$\varphi_3(1,0)=15.03$, $m_3(1,0)=2$, $c_0^2(1,0)=1111\ 0000\ 1111$
$\varphi_3(2,0)=15.49$, $m_3(2,0)=1$, $c_0^2(2,0)=1111\ 0000\ 1111$
$\varphi_3(3,0)=16.63$, $m_3(3,0)=0$, $c_0^2(3,0)=0000\ 1111\ 1111$
$\varphi_3(0,1)=14.66$, $m_3(0,1)=0$, $c_0^2(0,1)=1111\ 1111\ 1111$
$\varphi_3(1,1)=15.75$, $m_3(1,1)=0$, $c_0^2(1,1)=0000\ 0000\ 1111$
$\varphi_3(2,1)=16.46$, $m_3(2,1)=2$, $c_0^2(2,1)=1111\ 1111\ 1111$
$\varphi_3(3,0)=16.81$, $m_3(3,1)=1$, $c_0^2(3,1)=1111\ 0000\ 0000$
$\varphi_3(0,2)=6.13$, $m_3(0,2)=2$, $c_0^2(0,2)=1100\ 1100\ 0011$
$\varphi_3(1,2)=11.66$, $m_3(1,2)=1$, $c_0^2(1,2)=1100\ 1100\ 0011$
$\varphi_3(2,2)=11.96$, $m_3(2,2)=2$, $c_0^2(2,2)=0011\ 0011\ 0011$
$\varphi_3(3,2)=13.97$, $m_3(3,2)=3$, $c_0^2(3,2)=1100\ 1100\ 0011$
$\varphi_3(0,3)=9.27$, $m_3(0,3)=1$, $c_0^2(0,3)=1100\ 0011\ 0011$
$\varphi_3(1,3)=10.81$, $m_3(1,3)=0$, $c_0^2(1,3)=1100\ 0011\ 0011$
$\varphi_3(2,3)=12.20$, $m_3(2,3)=3$, $c_0^2(2,3)=0011\ 1100\ 0011$
$\varphi_3(3,3)=13.37$, $m_3(3,3)=0$, $c_0^2(3,3)=0011\ 1100\ 0011$ The same applies to calculation of branch labels between the time point 3 and a time point 4. By using this calculation, path metrics of surviving paths in the only state 0 at the end point t=4, indexes specifying reception signal sequences related to the calculation of the path metrics, and surviving path labels are calculated according to the terminating method (103) shown in FIG. 1, and they are calculated as follows.

Figure 9:
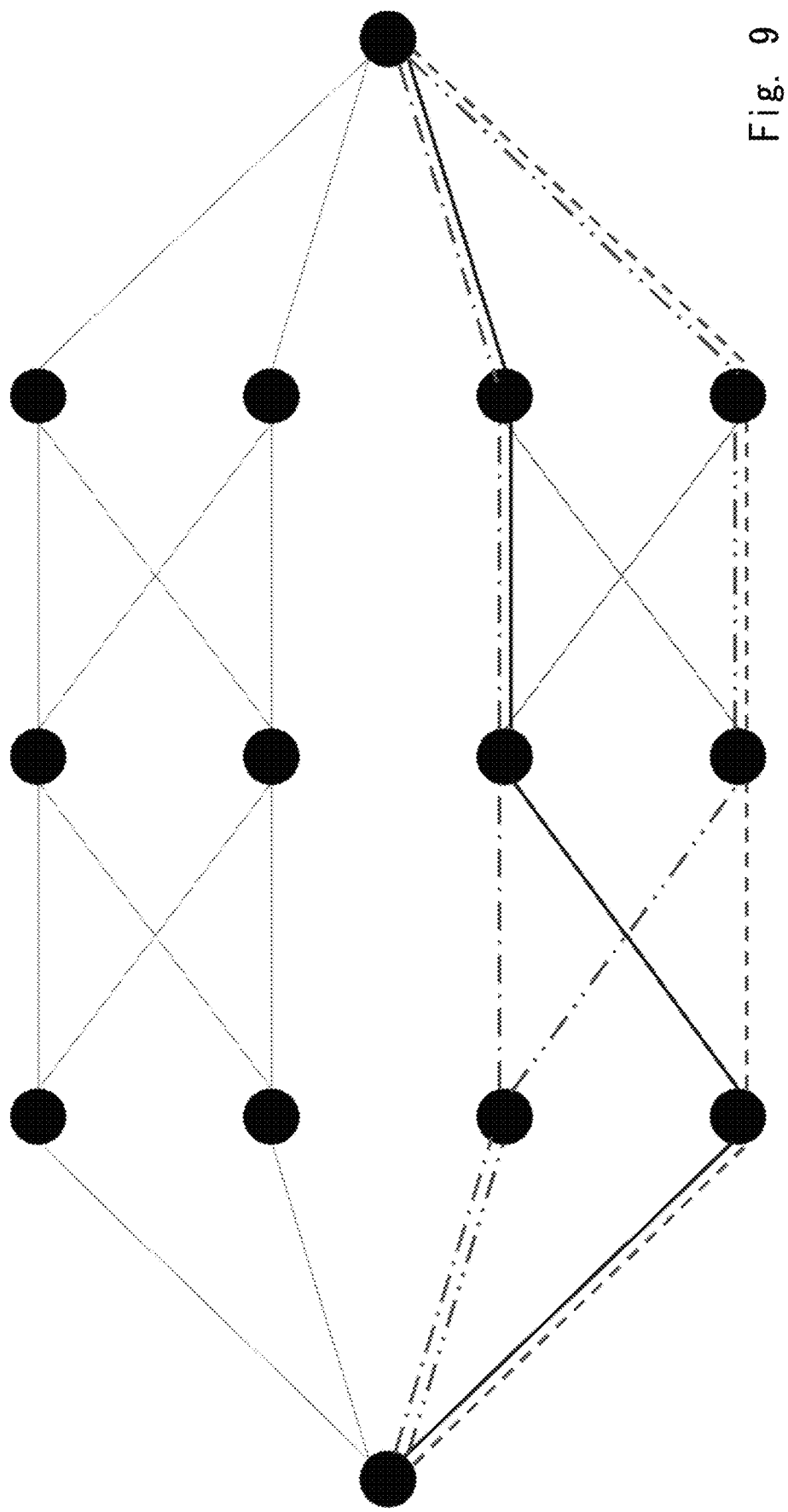
FIG. 9 shows surviving paths according to the second example embodiment.

$\varphi_4(0,0)=6.17$, $m_4(0,0)=0$, $c_0^3(0,0)=1100\ 1100\ 0011\ 0011$
$\varphi_4(1,0)=10.45$, $m_4(1,0)=1$, $c_0^3(1,0)=1100\ 0011\ 0011\ 1100$
$\varphi_4(2,0)=12.00$, $m_4(2,0)=2$, $c_0^3(2,0)=0011\ 0011\ 0011\ 0011$
$\varphi_4(3,0)=13.38$, $m_4(3,0)=3$, $c_0^3(3,0)=0011\ 1100\ 0011\ 1100$ FIG. 9 shows four surviving paths at the end point in the trellis diagram shown in FIG. 8. The solid line corresponds to a 16-bit sequence of $c_0^3(0,0)$, and the broken line corresponds to that of $c_0^3(1,0)$. Further, the dashed line corresponds to that of $c_0^3(2,0)$, and the double-dashed line corresponds to that of $c_0^3(3,0)$. They are four transmission signal sequences having high likelihoods (small metrics) for at least one of the four reception signal sequences $r_0^3(m)$, m=0,1,2,3. Note that in this example, one transmission signal sequence having the highest likelihood is selected for each of the four reception signal sequences. In general, however, this is not always true. That is, in some cases, four transmission signal sequences having high likelihoods are selected for one reception signal sequence.

As described above, the multi-input/list output Viterbi decoder shown in FIG. 3 can calculate a plurality of transmission signal sequences having high likelihoods for at least one of a plurality of reception signal sequences.

Third Example Embodiment

Next, a flowchart of a multi-input/list output Viterbi decoding method performed by a decoding apparatus according to a third example embodiment will be described with reference to FIG. 4.

Figure 4:
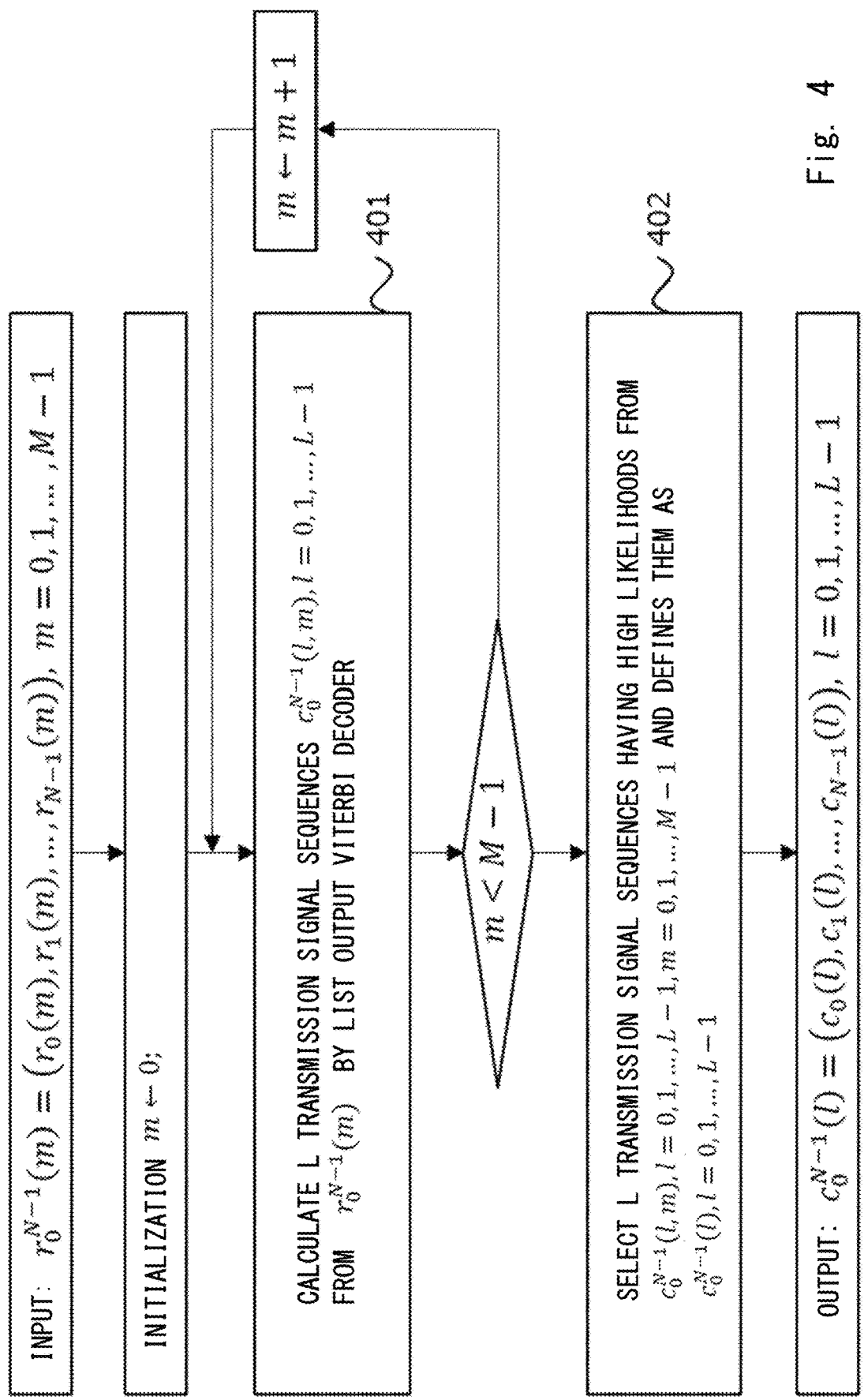
FIG. 4 is a flowchart of a multi-input/list output Viterbi decoding method according to a third example embodiment.

FIG. 4 is a flowchart of the multi-input/list output Viterbi decoding method according to the third example embodiment. The flowchart shown in FIG. 4 includes a list output Viterbi decoding method (401) and a selection method (402). In the list output Viterbi decoding method (401), a list of L transmission signal sequences having high likelihoods is output for one given reception signal sequence. In the selection method (402), L transmission signal sequences are selected from M×L transmission signal sequences in descending order of the likelihood.

Figure 5:
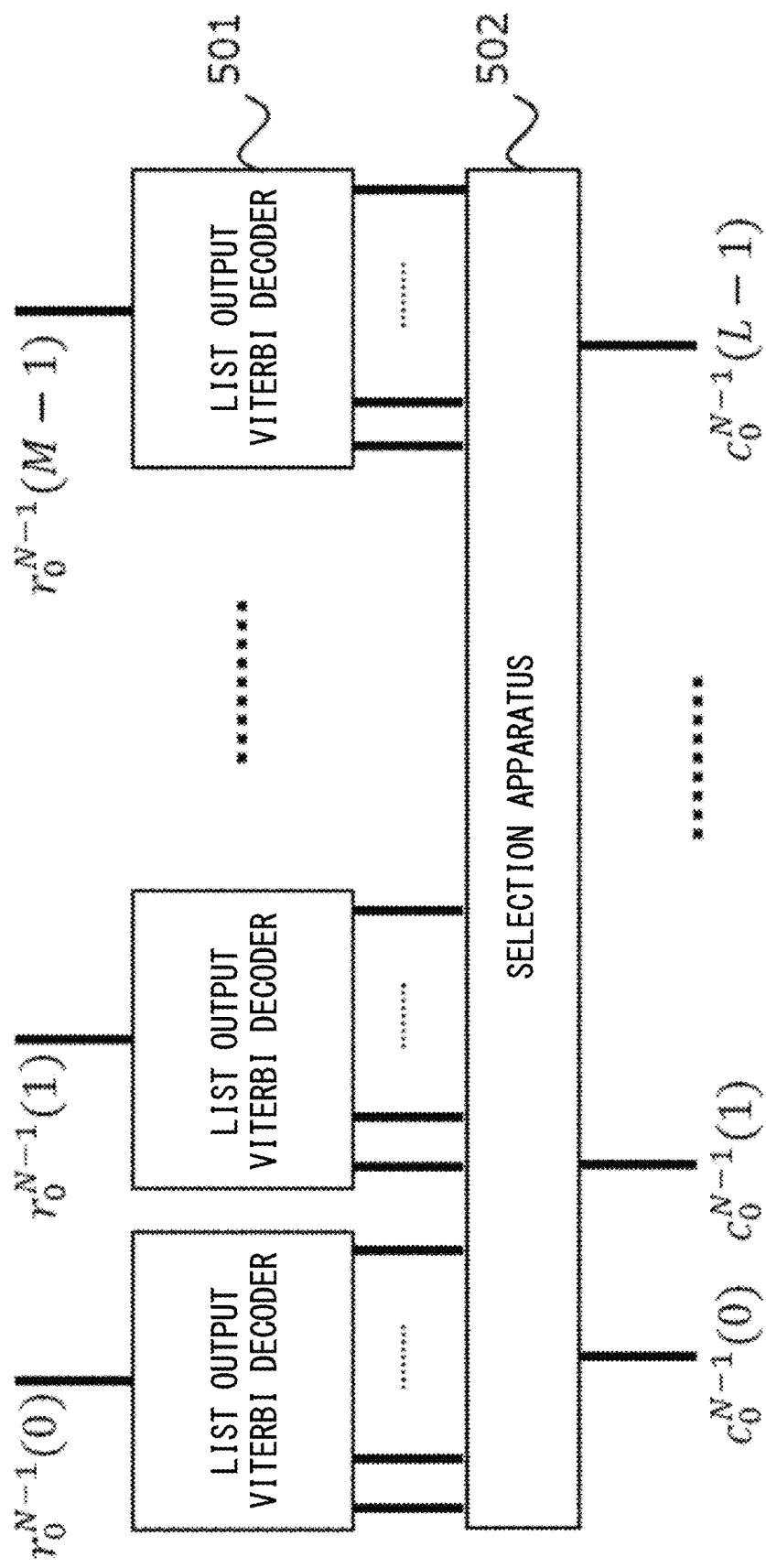
FIG. 5 is a configuration diagram of a multi-input/list output Viterbi decoder according to the third example embodiment.

FIG. 5 is a block diagram showing an example of a configuration of the multi-input/list output Viterbi decoder according to the third example embodiment. The multi-input/list output Viterbi decoder includes a plurality of list output Viterbi decoders 501 and a selection apparatus 502. The multi-input/list output Viterbi decoder shown in FIG. 5 includes M list output Viterbi decoders 501 that output a list of L transmission signal sequences having high likelihoods for one given reception signal sequence. Further, the multi-input/list output Viterbi decoder shown in FIG. 5 includes the selection apparatus 502 that selects, from a total of M×L transmission signal sequences output by these list output Viterbi decoders 501, L transmission signal sequences in descending order of the likelihood.

Next, the multi-input/list output Viterbi decoding method shown in FIG. 4 will be described. Similarly to the method shown in FIG. 1, M reception signal sequences each having a length N, i.e., reception signal sequences represented as $r_0^{N-1}(m)$, m=0, 1, . . . , M−1, are given as inputs to the multi-input/list output Viterbi decoder.

The list output Viterbi decoders 501 select, for each reception signal sequence $r_0^{N-1}(m)$, L transmission signal sequences $c_0^{N-1}(l, m)$, l=0, 1, . . . , L−1 in descending order of the likelihood from the one having the highest likelihood by using the list output Viterbi decoding method (401). The multi-input/list output Viterbi decoder performs the list output Viterbi decoding method (401) M times by using the M list output Viterbi decoders 501. As a result, a total of M×L transmission signal sequences are obtained.

Next, in the selection method (402), the selection apparatus 502 selects L transmission signal sequences $c_0^{N-1}(l)$, l=0, 1, . . . , L−1 having the largest likelihoods from the M×L transmission signal sequences. Specifically, the selection apparatus 502 selects L transmission signal sequences by using the likelihood information (metrics) that is used for selecting L transmission signal sequences in the list output Viterbi decoding method (401).

Operations performed by the multi-input/list output Viterbi decoder according to the third example embodiment shown in FIG. 5 are similar to those in the multi-input/list output Viterbi decoder method shown in FIG. 4.

As described above, with the output of the multi-input/list output Viterbi decoder shown in FIG. 5, it is possible to calculate L transmission signal sequences from transmission signal sequences having the highest likelihoods for at least one of the M given reception signal sequences. Further, the output of the multi-input/list output Viterbi decoder described above with reference to FIGS. 4 and 5 is similar to the output result of the multi-input/list output Viterbi decoder described above with reference to FIG. 8.

Note that the multi-input/list output Viterbi decoder shown in FIG. 5 requires an amount of calculation and a scale of an apparatus equivalent to those of M times of a single list Viterbi decoder scheme.

In contrast to this, the multi-input/list output Viterbi decoder shown in FIG. 3 described in the second example embodiment may have an amount of calculation and a scale of an apparatus equivalent to those of a single list Viterbi decoder scheme. However, there are cases in which the multi-input/list output Viterbi decoder shown in FIG. 3 may not always provide a list of L transmission signal sequences in descending order of the likelihood from the one having the highest likelihood for at least one of the M given reception signal sequences. In contrast to this, the output of the multi-input/list output Viterbi decoder described in the third example embodiment is a list of L transmission signal sequences arranged in descending order of the likelihood from the one having the highest likelihood.

Four Example Embodiment

Figure 6:
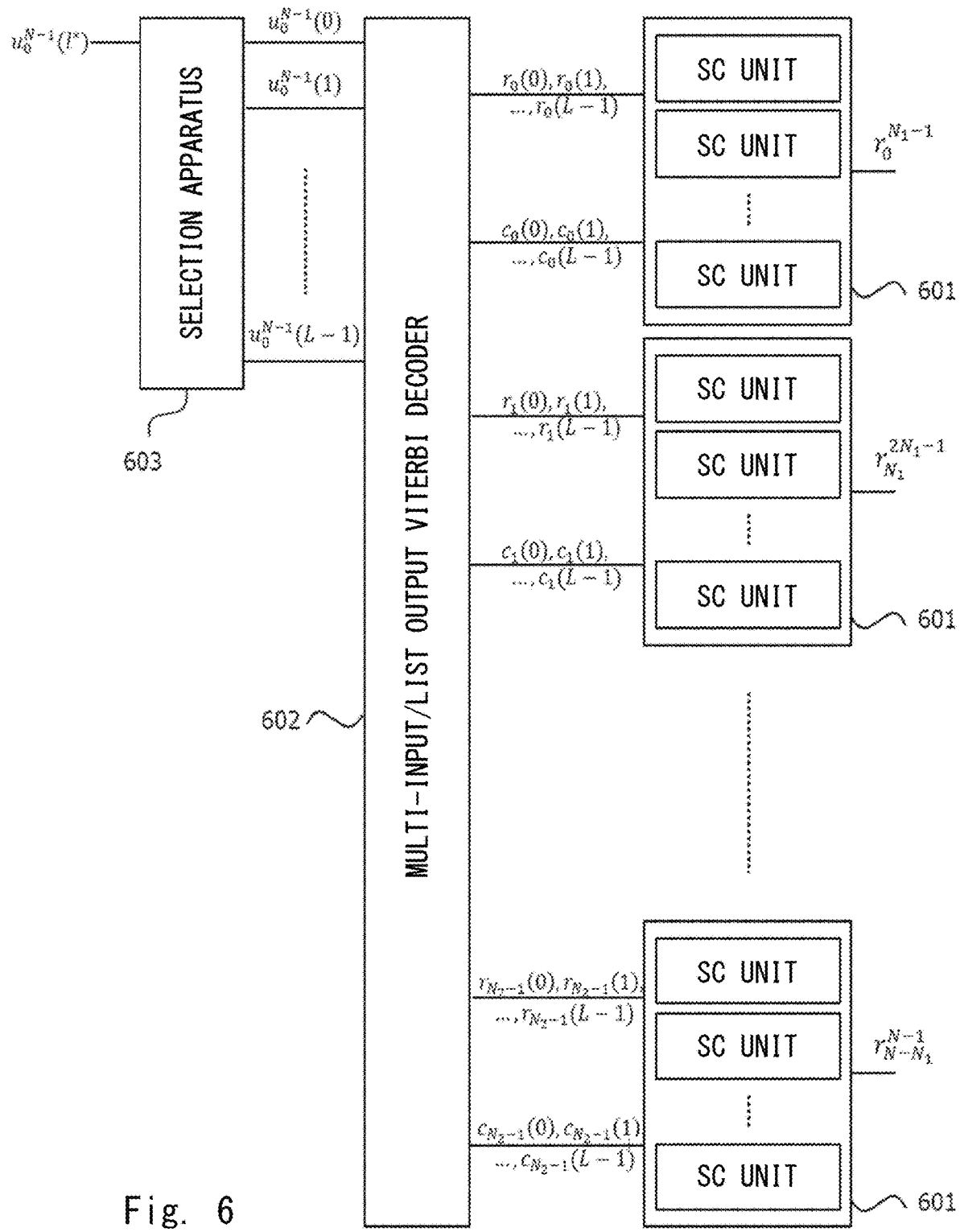
FIG. 6 is a configuration diagram of a decoder according to a fourth example embodiment.

Next, an example of a configuration of a decoder according to a fourth example embodiment will be described with reference to FIG. 6. FIG. 6 is a block diagram showing an example of a configuration of a decoder having a list size L for Polar codes each having a length of N bits (N=$N_1 \times N_2$). A list decoding calculation unit 601 includes L SC (Successive Cancelation) units each of which performs decoding processing of a Polar code having a length $N_1$. Further, the decoder shown in FIG. 6 includes $N_2$ list decoding calculation units 601.

Further, a multi-input/list output Viterbi decoder 602 outputs a list of L transmission signal sequences having high likelihoods for at least one of M given reception signal sequences (M is a positive number no greater than L) having a length $N_2$. The multi-input/list output Viterbi decoder 602 is the multi-input/list output Viterbi decoder shown in FIG. 3 or FIG. 5. A selection apparatus 603 selects one transmission signal sequence from a list output from the multi-input/list output Viterbi decoder 602.

Next, operations performed by a Polar-code list decoder shown in FIG. 6 will be described. The list decoder receives a reception signal sequence $r_0^{N-1}$ for a Polar-encoded transmission signal sequence having a length N. This reception signal sequence $r_0^{N-1}$ having the length N is divided into $N_2$ reception signal sequences each having a length $N_1$ and hence becomes sequences $r_0^{N_1-1}$, $r_{N_1}^{2N_1-1}$, . . . , $r_{N-N_1}^{N-1}$. Each of the divided reception signal sequences is input to a respective one of the list decoding calculation units 601 each of which has L SC (Successive Cancellation) units each of which performs SC decoding processing for the Polar code having the length $N_1$.

The number of list decoding calculation units 601 is $N_2$ in total. Numbers 0 to $N_2-1$ are assigned to the $N_2$ list decoding operation units 601. A kth list decoding calculation unit 601 processes a reception signal sequence $r_{kN_1}^{(k+1)N_1-1}$ having a length $N_1$ according to an SC algorithm. Further, the kth list decoding calculation unit 601 successively outputs candidates for likelihood information about each bit, starting from the head bit, of the transmission bit string having the length $N_1$, i.e., outputs $r_k(0)$, $r_k(1)$, . . . , $r_k(L-1)$ for L patterns.

It is assumed that the list decoding calculation unit 601 has performed calculation and obtained candidates, for an ith bit (i is an integer no greater than $N_1-1$), for likelihood information for L patterns. By collecting likelihood information for L patterns over all the cases expressed by k=0, 1, . . . , $N_2-1$, L sequences $r_0^{N_2-1}(m)$, m=0, 1, . . . , L−1 each having a length $N_2$ are obtained. The multi-input/list output Viterbi decoder 602 regards them as L reception signal sequences, and thereby receives the L reception signal sequences. Further, the multi-input/list output Viterbi decoder 602 calculates a list of L transmission signal sequences each having a length of $N_2$ bits, i.e., sequences represented as $c_0^{N_2-1}(m)$, m=0, 1, . . . , L−1.

The information multi-input/list output Viterbi decoder 602 feeds back $c_k(0)$, $c_k(1)$, . . . , $c_k(L-1)$ to the list decoding calculation units 601 as hard decision information corresponding to likelihood information $r_k(0)$, $r_k(1)$, . . . , $r_k(L-1)$ for L patterns.

By using the feedback of the hard decision information, the list decoding calculation units 601 calculate candidates for likelihood information about the next (i+1)th bit for L patterns in a similar manner. By repeating the above-described processes, i.e., repeating the execution of the multi-input/list output Viterbi decoder $N_1$ times in total, the multi-input/list output Viterbi decoder 602 can obtain candidates $u^{N-1}(l)$, l=0, 1, . . . , L−1 for L transmission bit sequences for the reception signal sequence $r_0^{N-1}$.

The selection apparatus 603 selects and outputs one of the candidates $u^{N-1}(l)$, l=0, 1, . . . , L−1 for the transmission bit sequence. As an example, there is a method in which a CRC (Cyclic Redundancy Check) bit for detecting an error is included in transmission bits in advance and a candidate in which no error is detected is selected.

Next, an effect of reducing the number of processing steps performed by the Polar-code list decoder shown in FIG. 6 will be described by using a specific example. For example, a case where a Polar code having a length N of 1,024 bits (N=1,024) is list-decoded with a list size L of eight (L=8) will be described. In the list decoder shown in FIG. 6, when $N_1$ is 64 ($N_1$=64) and $N_2$ is 16 ($N_2$=16), the number of processing steps performed by the list decoding calculation units 601 is estimated to be 126 ($2N_1-2=126$). For the multi-input/list output Viterbi decoder having a length $N_2$ of 16 ($N_2=16$), as shown in the second example embodiment, a trellis diagram corresponding thereto can be expressed by using four time points, a branch label(s) having four bits, and eight states at maximum. Therefore, since the number of processing steps for one operation is four and this operation is performed $N_1$ times, the number of processing steps becomes 256 ($4\times64=256$). Therefore, in principle, the Polar-code list decoder shown in FIG. 6 can perform the list decoding processing in 382 steps ($126+256=382$) in total. In contrast to this, in an ordinary Polar-code list decoder, when processing is performed by using a list decoding unit having a length N of 1,024 bits (N=1,024) and a list size of eight, the number of processing steps is 2,046 ($2N-2=2,046$). Therefore, the number of steps in the Polar-code list decoder shown in FIG. 6 is greatly reduced.

Figure 7:
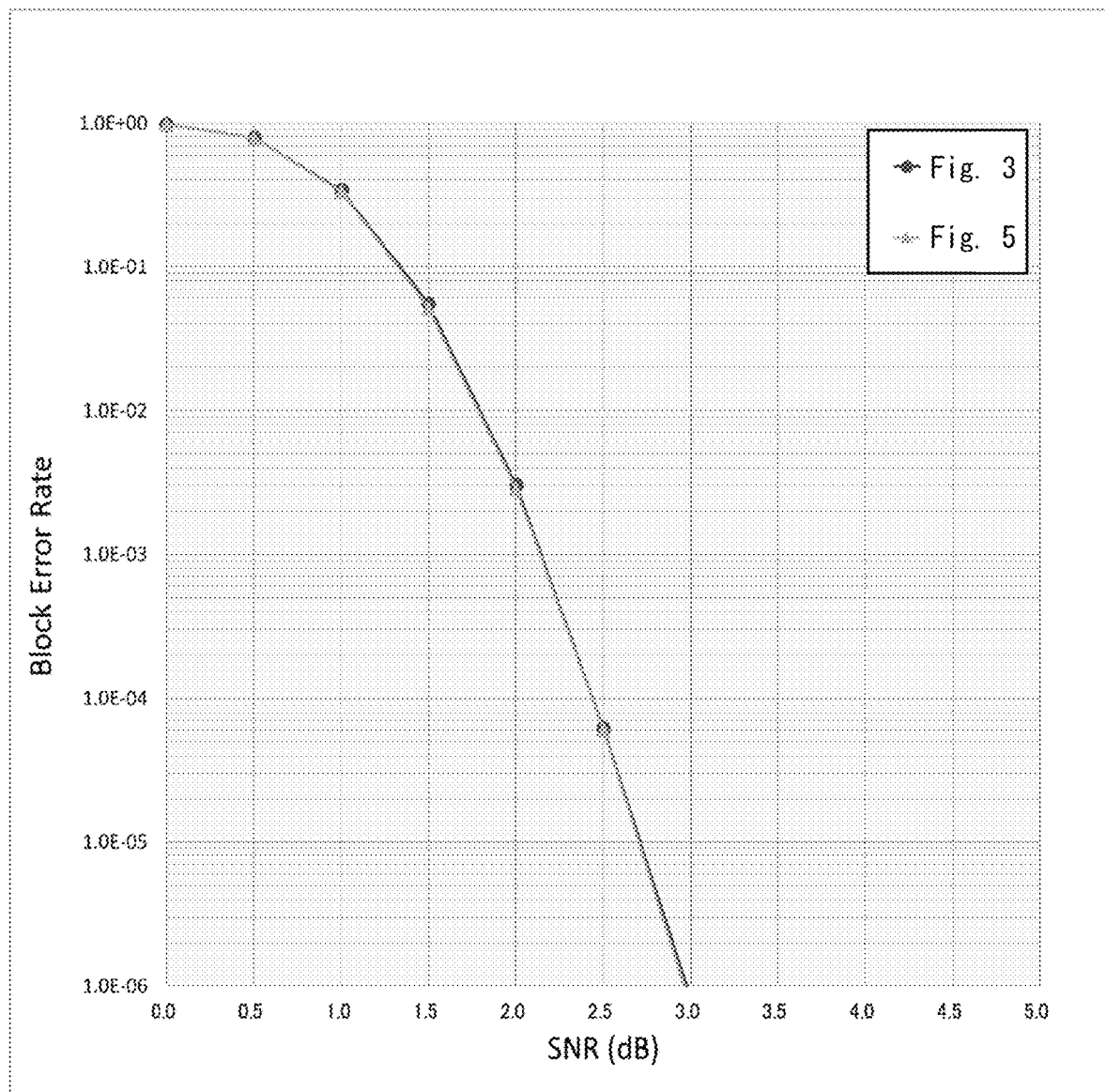
FIG. 7 is a graph showing an error rate characteristic obtained by performing decoding processing by using a list decoder of Polar code according to the fourth example embodiment.

FIG. 7 shows an error rate characteristic obtained by decoding Polar codes each having a length N of 1,024 bits (N=1,024) by using the Polar-code list decoder (having a list size L of eight (L=8)) shown in FIG. 6. As the multi-input/list output Viterbi decoder, the difference between the configuration shown in FIG. 3 and that shown in FIG. 5 is shown, and it can be understood that there is substantially no difference between them, though the configuration shown in FIG. 5 is slightly superior to that in FIG. 3.

Figure 11:
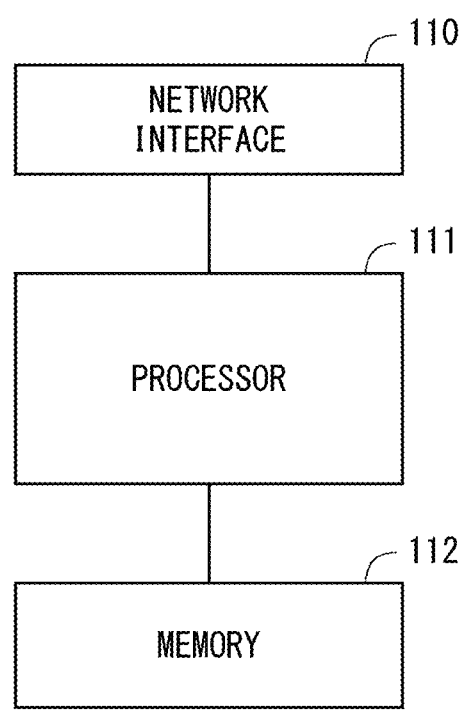
FIG. 11 is a configuration diagram of a decoder according to each of the example embodiments.

Next, an example of a configuration of each of the various decoders shown in FIGS. 3, 5 and 6 described in the above-described plurality of example embodiments will be described with reference to FIG. 11. FIG. 11 is a block diagram showing an example of a configuration of a decoder. Referring to FIG. 11, the decoder includes a network interface 110, a processor 111, and a memory 112. The network interface 110 is used to communicate with other network node apparatuses included in the communication system. The network interface 110 may include, for example, a network interface card (NIC) in conformity with IEEE 802.3 series.

The processor 111 loads software (a computer program) from the memory 112 and executes the loaded software, and thereby performs the processing of the decoder described in the above-described example embodiments with reference to the flowchart. The processor 111 may be, for example, a microprocessor, an MPU (Micro Processing Unit), or a CPU (Central Processing Unit). The processor 111 may include a plurality of processors.

The memory 112 is formed by, for example, a combination of a volatile memory and a nonvolatile memory. The memory 112 may include a storage remotely disposed from the processor 111. In this case, the processor 111 may access the memory 112 through an I/O interface (not shown).

In the example shown in FIG. 11, the memory 112 is used to store a group of software modules. The processor 111 loads the group of software modules from the memory 112 and executes the loaded software modules, and thereby performs the processing of the decoder described in the above-described example embodiments.

As described above with reference to FIG. 11, each of processors included in the decoder executes one or a plurality of programs including a group of instructions for causing a computer to perform the algorithms described above with reference to the drawings.

In the above-described examples, the program can be stored and given to a computer using any type of non-transitory computer readable media. Non-transitory computer readable media include any type of tangible storage media. Examples of non-transitory computer readable media include magnetic storage media, optical magnetic storage media, CD-ROM (compact disc read only memory), CD-R, CD-R/W, and semiconductor memories. Examples of the magnetic storage media include flexible disks, magnetic tapes, and hard disk drives. Examples of the optical magnetic storage media include magneto-optical disks. Examples of the semiconductor memories include mask ROM, PROM (programmable ROM), EPROM (Erasable PROM), flash ROM, and RAM (random access memory). Further, the program may be given to a computer using any type of transitory computer readable media. Examples of transitory computer readable media include electric signals, optical signals, and electromagnetic waves. Transitory computer readable media can provide the program to a computer via a wired communication line (e.g. electric wires, and optical fibers) or a wireless communication line.

Note that the present disclosure is not limited to the above-described embodiments and can be modified as appropriate without departing from the spirit and scope of the present disclosure.

The whole or part of the embodiments disclosed above can be described as, but not limited to, the following supplementary notes.

Supplementary Note 1

A decoding apparatus comprising:
a multi-input branch metric calculation unit configured to calculate, by using a branch label corresponding to a path extending toward a state S (S is an integer no less than zero) at a time point N (N is an integer no less than zero) in a trellis diagram and a plurality of reception signal sequences, a branch metric in the state S;
a path metric calculation unit configured to calculate a path metric in the state S at the time point N by adding a branch metric in the state S at the time point N to a path metric in each of states at a time point N−1, each of which forms a path with the state S at the time point N; and
a surviving path list memory configured to store path labels corresponding to L path metrics (L is an integer no less than one) among a plurality of calculated path metrics, wherein
the path metric calculation unit generates a path label in the state S at the time point N by combining the branch label with a path label in each of the states at the time point N−1, each of which forms a path with the state S at the time point N, and
the surviving path list memory outputs, as a transmission signal sequence, path labels corresponding to L path metrics selected at an end point in the trellis diagram.

Supplementary Note 2

The decoding apparatus described in Supplementary note 1, further comprising an index memory configured to store an index for specifying the reception signal sequence which is used to calculate the path metric.

Supplementary Note 3

The decoding apparatus described in Supplementary note 2, further comprising a path metric memory configured to store the calculated path metric, wherein
the path metric calculation unit adds the branch metric calculated by using the reception signal sequence indicated by the index to a path metric in each of states at the time point N−1 stored in the path metric memory.

Supplementary Note 4

The decoding apparatus described in any one of Supplementary notes 1 to 3, wherein the surviving path list memory stores path labels corresponding to L path metrics in ascending order of their values among the plurality of calculated path metrics.

Supplementary Note 5

The decoding apparatus described in any one of Supplementary notes 1 to 4, wherein
for an end point in the trellis diagram, the number of states is one, and
the path metric calculation unit calculates a path metric corresponding to a path extending toward one state at the end point in the trellis diagram, and generates a path label.

Supplementary Note 6

The decoding apparatus described in any one of Supplementary notes 1 to 5, further comprising calculation units each including L SC units, each of the SC units being configured to perform decoding processing of a Polar code having a length of $N_1$ bits ($N_1$ is an integer no less than one), each of the SC units having a list size of 1, wherein
the multi-input branch metric calculation unit calculates the branch metric by using L reception signal sequences each having a length of $N_2$ bits and the branch label, the L reception signal sequences being ones output from $N_2$ calculation units ($N_2$ is an integer no less than one).

Supplementary Note 7

A decoding apparatus comprising:
a list output Viterbi decoder configured to select L transmission signal sequences (L is an integer no less than one) in descending order of their likelihoods among a plurality of transmission signal sequences calculated from one reception signal sequence by using a Viterbi algorithm; and
a selection unit configured to output L transmission signal sequences selected in descending order of their likelihoods among M×L transmission signal sequences output from M list output Viterbi decoders (M is an integer no less than one).

Supplementary Note 8

The decoding apparatus described in Supplementary note 7, further comprising calculation unit each including L SC units, each of the SC units being configured to perform decoding processing of a Polar code having a length of $N_1$ bits ($N_1$ is an integer no less than one), each of the SC units having a list size of 1, wherein
the list output Viterbi decoder calculates a plurality of transmission signal sequences from reception signal sequences having a length of $N_2$ bits ($N_2$ is an integer no less than one) output from $N_2$ calculation units.

Supplementary Note 9

A decoding method comprising:
calculating, by using a branch label corresponding to a path extending toward a state S (S is an integer no less than zero) at a time point N (N is an integer no less than zero) in a trellis diagram and a plurality of reception signal sequences, a branch metric in the state S;
calculating a path metric in the state S at the time point N by adding a branch metric in the state S at the time point N to a path metric in each of states at a time point N−1, each of which forms a path with the state S at the time point N;
storing path labels corresponding to L path metrics (L is an integer no less than one) among a plurality of calculated path metrics;
generating a path label in the state S at the time point N by combining the branch label with a path label in each of the states at the time point N−1, each of which forms a path with the state S at the time point N; and
outputting, as a transmission signal sequence, path labels corresponding to L path metrics selected at an end point in the trellis diagram.

Supplementary Note 10

A decoding method comprising:
selecting L transmission signal sequences (L is an integer no less than one) in descending order of their likelihoods among a plurality of transmission signal sequences calculated from one reception signal sequence by using a Viterbi algorithm; and
outputting L transmission signal sequences selected in descending order of their likelihoods among M×L transmission signal sequences output from M list output Viterbi decoders (M is an integer no less than one).

Supplementary Note 11

A program for causing a computer to:
calculate, by using a branch label corresponding to a path extending toward a state S (S is an integer no less than zero) at a time point N (N is an integer no less than zero) in a trellis diagram and a plurality of reception signal sequences, a branch metric in the state S;
calculate a path metric in the state S at the time point N by adding a branch metric in the state S at the time point N to a path metric in each of states at a time point N−1, each of which forms a path with the state S at the time point N;
store path labels corresponding to L path metrics (L is an integer no less than one) among a plurality of calculated path metrics;
generate a path label in the state S at the time point N by combining the branch label with a path label in each of the states at the time point N−1, each of which forms a path with the state S at the time point N; and
output, as a transmission signal sequence, path labels corresponding to L path metrics selected at an end point in the trellis diagram.

Supplementary Note 12

A program for causing a computer to:
select L transmission signal sequences (L is an integer no less than one) in descending order of their likelihoods among a plurality of transmission signal sequences calculated from one reception signal sequence by using a Viterbi algorithm; and
output L transmission signal sequences selected in descending order of their likelihoods among M×L transmission signal sequences output from M list output Viterbi decoders (M is an integer no less than one).

REFERENCE SIGNS LIST

10 DECODING APPARATUS
11 MULTI-INPUT BRANCH METRIC CALCULATION UNIT
12 PATH METRIC CALCULATION UNIT
13 SURVIVING PATH LIST MEMORY
110 NETWORK INTERFACES
111 PROCESSOR
112 MEMORY
301 MULTI-INPUT BRANCH METRIC CALCULATION UNIT
302 PATH METRIC CALCULATION UNIT
303 PATH METRIC MEMORY
304 INDEX MEMORY
305 SURVIVING PATH LIST MEMORY
306 SELECTOR
501 LIST OUTPUT VITERBI DECODER
502 SELECTION APPARATUS
601 LIST DECODE ARITHMETIC UNIT
602 MULTI-INPUT/LIST OUTPUT VITERBI DECODER
603 SELECTION APPARATUS

The invention claimed is:

1. A decoding apparatus comprising:
at least one memory storing instructions, and
at least one processor configured to execute the instructions to;
calculate, by using a branch label corresponding to a path extending toward a state S (S is an integer no less than zero) at a time point N (N is an integer no less than zero) in a trellis diagram and a plurality of reception signal sequences, a branch metric in the state S;
calculate a path metric in the state S at the time point N by adding the branch metric in the state S at the time point N to a path metric in each of states at a time point N−1, each of which forms a path with the state S at the time point N; and
store path labels corresponding to L path metrics (L is an integer no less than one) among a plurality of calculated path metrics,
generate a path label in the state S at the time point N by combining the branch label with a path label in each of the states at the time point N−1, each of which forms a path with the state S at the time point N, and
output, as a transmission signal sequence, path labels corresponding to L path metrics selected at an end point in the trellis diagram; and
one or more hardware calculation units each including L successive cancelation (SC) units, each of the SC units is configured to perform decoding processing of a Polar code having a length of $N_1$ bits ($N_1$ is an integer no less than one), each of the SC units having a list size of 1,
wherein the at least one processor is further configured to execute the instructions to calculate the branch metric by using L reception signal sequences each having a length of $N_2$ bits and the branch label, the L reception signal sequences being ones output from $N_2$ hardware calculation units ($N_2$ is an integer no less than one).

2. The decoding apparatus according to claim 1, wherein the at least one processor is further configured to execute the instructions to store an index specifying the reception signal sequence that is used to calculate the path metric.

3. The decoding apparatus according to claim 2, wherein the at least one processor is further configured to execute the instructions to store the calculated path metric, and add the branch metric calculated by using the reception signal sequence indicated by the index to a path metric in each of states at the time point N−1 stored in the path metric memory.

4. The decoding apparatus according to claim 1, wherein the at least one processor is further configured to execute the instructions to store path labels corresponding to L path metrics in ascending order of their values among the plurality of calculated path metrics.

5. The decoding apparatus according to claim 1, wherein for an end point in the trellis diagram, the number of states is one, and
the at least one processor is further configured to execute the instructions to calculate a path metric corresponding to a path extending toward one state at the end point in the trellis diagram, and generates a path label.

6. A decoding method comprising:
calculating, by using a branch label corresponding to a path extending toward a state S (S is an integer no less than zero) at a time point N (N is an integer no less than zero) in a trellis diagram and a plurality of reception signal sequences, a branch metric in the state S;
calculating a path metric in the state S at the time point N by adding the branch metric in the state S at the time point N to a path metric in each of states at a time point N−1, each of which forms a path with the state S at the time point N;
storing path labels corresponding to L path metrics (L is an integer no less than one) among a plurality of calculated path metrics;
generating a path label in the state S at the time point N by combining the branch label with a path label in each of the states at the time point N−1, each of which forms a path with the state S at the time point N; and
outputting, as a transmission signal sequence, path labels corresponding to L path metrics selected at an end point in the trellis diagram, wherein
the method further comprises:
performing, using one or more hardware calculation unit each including L successive cancelation (SC) units, decoding processing of a Polar code having a length of $N_1$ bits ($N_1$ is an integer no less than one), each of the SC units having a list size of 1, and
calculating the branch metric by using L reception signal sequences each having a length of $N_2$ bits and the branch label, the L reception signal sequences being ones output from $N_2$ hardware calculation units ($N_2$ is an integer no less than one).

7. A non-transitory computer readable medium storing a program for causing a computer to:
calculate, by using a branch label corresponding to a path extending toward a state S (S is an integer no less than zero) at a time point N (N is an integer no less than zero) in a trellis diagram and a plurality of reception signal sequences, a branch metric in the state S;
calculate a path metric in the state S at the time point N by adding the branch metric in the state S at the time point N to a path metric in each of states at a time point N−1, each of which forms a path with the state S at the time point N;
store path labels corresponding to L path metrics (L is an integer no less than one) among a plurality of calculated path metrics;
generate a path label in the state S at the time point N by combining the branch label with a path label in each of the states at the time point N−1, each of which forms a path with the state S at the time point N; and output, as a transmission signal sequence, path labels corresponding to L path metrics selected at an end point in the trellis diagram, wherein the non-transitory computer readable medium is configure to further cause the computer to:

perform, using one or more hardware calculation unit each including L successive cancelation (SC) units, decoding processing of a Polar code having a length of $N_1$ bits ($N_1$ is an integer no less than one), each of the SC units having a list size of 1, and calculate the branch metric by using L reception signal sequences each having a length of $N_2$ bits and the branch label, the L reception signal sequences being ones output from $N_2$ hardware calculation units ($N_2$ is an integer no less than one).

* * * * *